United States Patent [19]
Everhart

[11] Patent Number: 6,020,047
[45] Date of Patent: *Feb. 1, 2000

[54] POLYMER FILMS HAVING A PRINTED SELF-ASSEMBLING MONOLAYER

[75] Inventor: Dennis S. Everhart, Alpharetta, Ga.

[73] Assignee: Kimberly-Clark Worldwide, Inc., Neenah, Wis.

[*] Notice: This patent issued on a continued prosecution application filed under 37 CFR 1.53(d), and is subject to the twenty year patent term provisions of 35 U.S.C. 154(a)(2).

[21] Appl. No.: 08/707,456

[22] Filed: Sep. 4, 1996

[51] Int. Cl.[7] .................................................. B32B 3/00
[52] U.S. Cl. .................. 428/209; 428/212; 428/403; 428/469; 428/704; 428/901
[58] Field of Search .................... 428/403, 204, 428/212, 704, 901, 469, 476.1, 441; 252/512, 518, 521

[56] References Cited

U.S. PATENT DOCUMENTS

| | | |
|---|---|---|
| Re. 33,581 | 4/1991 | Nicoli et al. . |
| 2,905,539 | 9/1959 | Bowerman . |
| 3,497,377 | 2/1970 | Allingham . |
| 3,641,354 | 2/1972 | De Ment . |
| 3,716,359 | 2/1973 | Sheridon . |
| 4,011,009 | 3/1977 | Lama et al. . |
| 4,173,075 | 11/1979 | Stewart . |
| 4,274,706 | 6/1981 | Tangonan . |
| 4,312,228 | 1/1982 | Wohltjen . |
| 4,325,779 | 4/1982 | Rossetti . |
| 4,330,175 | 5/1982 | Fujii et al. . |
| 4,382,657 | 5/1983 | Lemaitre . |
| 4,399,686 | 8/1983 | Kindlund et al. . |
| 4,477,158 | 10/1984 | Pollock et al. . |
| 4,512,848 | 4/1985 | Deckman et al. . |
| 4,528,260 | 7/1985 | Kane . |
| 4,561,286 | 12/1985 | Sekler et al. . |
| 4,562,157 | 12/1985 | Lowe et al. . |

(List continued on next page.)

FOREIGN PATENT DOCUMENTS

| | | |
|---|---|---|
| 0 453 820 | 10/1991 | European Pat. Off. . |
| 0 657 737 | 6/1995 | European Pat. Off. . |
| 91/05999 | 5/1991 | WIPO . |
| WO 95/12480 | 5/1995 | WIPO . |
| 96/26435 | 8/1996 | WIPO . |
| 96/33971 | 10/1996 | WIPO . |
| WO 97/07429 | 2/1997 | WIPO . |

OTHER PUBLICATIONS

Copy of Search Report for PCT/US97/08522 dated Aug. 8, 1997.

R. Block et al., "Mechanical resonance gas sensors with piezoelectric excitation and detection using PVDF polymer foils", Sensors and Actuators, vol. B7, Mar. 1992, pp. 596–601.

S.J. Martin, "Sensing liquid properties with thickness–shear mode resonators", Sensors and Acutators A, vol. A44, Sep. 1994, pp. 209–218.

(List continued on next page.)

*Primary Examiner*—Merrick Dixon
*Attorney, Agent, or Firm*—Jones & Askew, LLP

[57] ABSTRACT

The present invention comprises methods of contact printing of patterned, self-assembling monolayers of alkanethiolates, carboxylic acids, hydroxamic acids, and phosphonic acids on thermoplastic films metallized with an alloy such as nickel/gold, the compositions produced thereby, and the use of these compositions. Patterned self-assembling monolayers allow for the controlled placement of fluids thereon which contain a chemically reactive, indicator functionality. The optical sensing devices produced thereby when the film is exposed to an analyte and light, can produce optical diffraction patterns which differ depending on the reaction of the self-assembling monolayer with the analyte of interest. The light can be in the visible spectrum, and be either reflected from the film, or transmitted through it, and the analyte can be any compound reacting with the fluid on the self-assembling monolayer. The present invention also provides a flexible support for a self-assembling monolayer on a metal alloy.

17 Claims, 5 Drawing Sheets

U.S. PATENT DOCUMENTS

| | | |
|---|---|---|
| 4,582,566 | 4/1986 | Grey . |
| 4,587,213 | 5/1986 | Malecki . |
| 4,596,697 | 6/1986 | Ballato . |
| 4,690,715 | 9/1987 | Allara et al. . |
| 4,728,591 | 3/1988 | Clark et al. . |
| 4,731,155 | 3/1988 | Napoli et al. . |
| 4,802,951 | 2/1989 | Clark et al. . |
| 4,818,336 | 4/1989 | Rossetti . |
| 4,837,715 | 6/1989 | Ungpiyakul et al. . |
| 4,842,633 | 6/1989 | Kuribayashi et al. . |
| 4,844,613 | 7/1989 | Batchelder et al. . |
| 4,851,816 | 7/1989 | Macias et al. . |
| 4,868,034 | 9/1989 | Steinberg ........................... 428/403 |
| 4,877,747 | 10/1989 | Stewart . |
| 4,895,017 | 1/1990 | Pyke et al. . |
| 4,897,325 | 1/1990 | Akkapeddi et al. . |
| 4,983,436 | 1/1991 | Bailey ................................. 428/40 |
| 4,992,385 | 2/1991 | Godfrey ............................. 436/525 |
| 4,999,489 | 3/1991 | Huggins . |
| 5,018,829 | 5/1991 | Ogawa . |
| 5,020,879 | 6/1991 | Kuzuta et al. . |
| 5,023,053 | 6/1991 | Finlan . |
| 5,032,216 | 7/1991 | Felten . |
| 5,035,863 | 7/1991 | Finlan et al. . |
| 5,055,265 | 10/1991 | Finlan . |
| 5,063,081 | 11/1991 | Cozzette et al. . |
| 5,064,619 | 11/1991 | Finlan . |
| 5,076,094 | 12/1991 | Frye et al. . |
| 5,079,600 | 1/1992 | Schnur et al. . |
| 5,143,854 | 9/1992 | Pirrung et al. . |
| 5,182,135 | 1/1993 | Giesecke et al. ................. 427/98 |
| 5,189,902 | 3/1993 | Groeninger . |
| 5,202,227 | 4/1993 | Matsuda et al. . |
| 5,235,238 | 8/1993 | Nomura et al. . |
| 5,242,828 | 9/1993 | Bergström et al. . |
| 5,255,273 | 10/1993 | Nilsson et al. . |
| 5,259,926 | 11/1993 | Kuwabara et al. . |
| 5,268,306 | 12/1993 | Berger et al. . |
| 5,294,369 | 3/1994 | Shigekawa et al. . |
| 5,315,436 | 5/1994 | Lowenhar et al. . |
| 5,327,225 | 7/1994 | Bader et al. ....................... 356/445 |
| 5,334,303 | 8/1994 | Muramatsu et al. . |
| 5,374,563 | 12/1994 | Maule . |
| 5,402,075 | 3/1995 | Lu et al. . |
| 5,404,756 | 4/1995 | Briggs et al. . |
| 5,415,842 | 5/1995 | Maule . |
| 5,418,136 | 5/1995 | Miller et al. . |
| 5,436,161 | 7/1995 | Bergström et al. . |
| 5,451,683 | 9/1995 | Barrett et al. . |
| 5,455,475 | 10/1995 | Josse et al. . |
| 5,468,606 | 11/1995 | Bogart et al. . |
| 5,474,884 | 12/1995 | Okazaki .............................. 430/533 |
| 5,482,830 | 1/1996 | Bogart et al. . |
| 5,482,867 | 1/1996 | Barrett et al. . |
| 5,489,678 | 2/1996 | Fodor et al. . |
| 5,512,131 | 4/1996 | Kumar et al. . |
| 5,514,559 | 5/1996 | Markert-Hahn et al. . |
| 5,527,711 | 6/1996 | Tom-Moy et al. . |
| 5,554,541 | 9/1996 | Malmqvist et al. . |
| 5,620,850 | 4/1997 | Bamdad et al. . |
| 5,643,681 | 7/1997 | Voorhees et al. . |
| 5,658,443 | 8/1997 | Yamamoto et al. . |

OTHER PUBLICATIONS

Abstract of EP 0 453 820 dated Oct. 30, 1991.

Muller, W. et al., Science, vol. 262, Dec 10, 1993, pp. 1706–1708.

Jennane, J. et al. Can. J. Chem. vol. 74, 1996, pp. 2509–2517.

Diamandis, EP et al., *Clin. Chem.*, vol. 37(5), 1991, pp. 625–633.

Bhatia, S.K. et al., 1992, *J. Am. Chem. Soc.*, vol. 114, p. 4432.

Bhatia, S.K. et al., Analytical Biochem., vol. 208, pp. 197–205, 1993.

Häussling, L. et al., Angew Chem. Int. Ed. Engl., vol. 30, No. 5, 1991, pp. 569–572.

Larsen N.B. et al., "Order in Microcontact Printed Self–Assembled Monolayers", *J. Am. Chem. Soc.* vol. 119, pp. 3017–3026, 1997.

Abstract: 120:231703CA, "Scanning Probe Lithography.2. Selective Chemical Vapor Deposition of Copper into Scanning Tunneling Microscope–Defined Patterns", Schoer, Jonathan et al.

Abstract: Japan, JP2165933, (Seiko Epson Corp.), "Manufacture of Microlens Array", Jun. 26, 1990.

Abstract: Japan, JP2140702, (Fujitsu Ltd.), "Rotary Variable Focal Mirror", May 30, 1990.

Abstract: Japan, JP2210302, (Hamamatsu Photonics KK), "Focal Distance Variable Mirror", Aug. 21, 1990.

Abstract: Japan, 58–150148, (Toshiba Corp.), Sep. 6, 1983.

Moffat, T.P., et al., "Patterned Metal Electrodeposition Using an Alkanethiolate Mask", *J. Electrochem Soc.*, vol. 142, No. 11, pp. 220–221 (Nov. 1995).

Dobisz, Elizabeth, A., et al., "Self–Assembled Monolayer Films for Nanofabrication", *Mat. Res. Soc. Symp. Proc.*, vol. 380, pp. 23–33 (1995).

Kim, Enoch, et al., "Combining Patterned Self–Assembled Monolayers of Alkanethiolates of Gold with Anisotropic Etching of Silicon to Generate Controlled Surface Morphologies", *J. Electrochem. Soc.*, vol. 142, No. 2, pp. 628–633 (Feb. 1995).

Laibinis, Paul, E., et al., "Comparison of the Structures and Wetting Properties of Self–Assembled Monolayers on n–Alkanethiols on the Coinage Metal Surfaces, Cu, Ag, Au1", *Amer. Chem., Soc.*, vol. 113, No. 19, pp. 7152–7167 (1991).

Lopez, Gabriel P., et al., "Convenient Methods for Patterning the Adhesion of Mammalian Cells to Surfaces Using Self–Assembled Monolayers of Alkanethiolates on Gold", *Amer. Chem. Soc.*, vol. 115, No. 13, pp. 5877–5878 (1993).

Dulcey, Charles, S., et al., "Deep UV Photochemistry of Chemisorbed Monolayers: Patterned Coplanar Molecular Assemblies", *Science*, vol. 252, pp. 551–554 (Apr. 1991).

Jacobsen, S.C., et al., "Design, Analysis, and Experimental Results for the Wobble Motor: an Eccentric–Motion Electrostatic Microactuator", *Prec. Eng. Optom.*, vol. 1167, pp. 122–136 (1989).

Matsuda, T., et al., "Development of Micropatterning Technology for Cultured Cells", *Trans. Am. Soc. Artif Intern Organs*, vol. XXXV, pp. 559–562 (1990).

Singhvi, Rahul, et al., "Engineering Cell Shape and Function", *Science*, vol. 264, pp. 696–698 (Apr. 1994).

Jacobsen, Stephen, C., et al., "Fabrication of Micro–Structures Using Non–Planar Lithography (NPL)", *Ctr. for Eng. Design*, 6 pages.

Westermark, Bengt, "Growth Control in Miniclones of Human Glial Cells", *Exp. Cell Res.*, vol. 111, pp. 295–299 (1978).

Lopez, Gabriel, P., et al., "Imaging of Features on Surfaces by Condensation Figures", *Science*, vol. 260, pp. 647–649 (Apr. 1993).

Parikh, Atul, N., et al., "An Intrinsic Relationship between Molecular Structure in Self–Assembled n–Alkylsiloxane Monolayers and Deposition Temperature", *J. Phys. Chem.*, vol. 98, No. 31, pp. 7577–7590 (1994).

Ireland, G.W., et al., "Limitation of Substratum Size Alters Cyoskeletal Organization and Behavior of Swiss 3T3 Fibroblasts", *Cell Biol, Itl.*, vol. 13, No. 9, pp. 781–790 (Sep. 1989).

Abbott, Nicholas, L., "Manipulation of the Wettability of Surfaces on the 0.1–to 1–Micrometer Scale Through Micromachining and Molecular Self–Assembly", *Science*, vol. 257, pp. 1380–1382 (Sep. 1992).

Britland, Stephen, et al., "Micropatterned Substratum Adhesiveness: A Model for Morphogenetic Cues Controlling Cell Behavior", *Exp. Cell Res.*, vol. 198, pp. 124–129 (1992).

Molecular Recognition at Self–Assembled Monolayers: Optimization of Surface Functionalization, *J. Chem. Phys.*, vol. 99, No. 9, pp. 7012–7019 (Nov. 1993).

Vargo, Terrence, G., "Monolayer Chemical Lithography and Characterization of Fluoropolymer Films", *Langmuir*, vol., 8, No. 1, pp. 130–134 (1992).

O'Neill, Charles, et al., "Narrow Linear Strips of Adhesive Substratum are Powerful Inducers of Both Growth and Total Focal Contact Area", *Cell Science*, vol., 95, pp. 577–586 (1990).

Kumar, Amit, et al., "Patterning Self–Assembled Monolayers: Applications in Materials Science", *Langmuir*, vol., 10, pp. 1498–1511 (1994).

Abbott, Nicholas, L., et al., "Potential–Dependent Wetting Aqueous Solutions on Self–Assembled Monolayers Formed from 15–(Ferrocenylcarbonyl) pentadecanethiol on Gold", *Langmuir*, vol. 10, No. 5, pp. 1493–1497 (1994).

Ponten, Jan, et al., "Proliferation Control in Cloned Normal and Malignant Human Cells", *Exp. Cell. Res.*, vol. 129, pp. 367–375 (1980).

McGovern, Mark, E., et al., "Role of Solvent on the Silanization of Glass with Octadecyltrichlorosilane", *Langmuir*, vol. 10, No. 10, pp. 3607–3614 (1994).

Article: Cromie, William J., "Self–Assembling Molecules Manipulated by Chemists", pp. 1–30.

Tiberio, R.C. et al., "Self–Assembled Monolayer Electron Beam Resist on GaAs", *Amer. Inst. Phys.*, (Feb. 1993).

Biebuyck, Hans, A., et al., "Self–Organization of Organic Liquids on Patterned Self–Assembled Monolayers of Alkanethiolates on Gold", *Langmuir*, vol., 10, No. 8, pp. 2790–2793 (1994).

Huber, M.C.E., et al., "Toroidal Grating Obtained on an Elastic Substrate", *Applied Optics*, vol. 20, No. 12, pp. 2139–2142 (Jun. 1981).

Gorman, Christopher, B., et al., "Use of a Patterned Self–Assembled Monolayer to Control the Formation of a Liquid Resist Pattern on a Gold Surface", *Chem. Mater.*, vol. 7, No. 2, pp. 252–254 (1995).

Kumar, Amit, et al., "The Use of Self–Assembled Monolayers and a Selective Etch to Generate Patterned Gold Features", *Am. Chem. Soc.*, pp. 9188–9189 (1992).

Tarlov, Michael J., et al., "UV Photopatterning of Alkanethiolate Monolayers Self–Assembled on Gold and Silver", *J. Am. Chem. Soc.*, vol. 11, No. 12, pp. 5305–5306 (1993).

Whitesides, George, M., et al., "Wet Chemical Approaches to the Characterization of Organic Surfaces: Self Assembled Monolayers, Wetting, and the Physical–Organic Chemistry of the Solid–Liquid Interface", *Langmuir*, vol. 6, pp. 87–96 (1990).

Jacobsen, S.C., et al., "The Wobble Motor: Design, Fabrication and Testing of an Eccentric–Motion Electrostatic Micromactuator", *IEEE*, vol. 8, pp. 1536–1546 (1989).

Wilbur, James L., et al., "Microfabrication by Microcontact Printing of Self–Assembled Monolayers", *Adv. Mater.*, vol. 6, No. 7/8, pp. 600–604 (1994).

Gorman, Christopher, B., et al., "Fabrication of Patterned, Electrically Conducting Polyprrole Using a Self–Assembled Monolayer: A Route to All–Organic Circuits", *Chem. Mater.*, vol. 7, No. 3, pp. 526–529 (1995).

Abbott, Nicholas, L., et al., "Active Contol of Wetting Using Applied Electrical Potentials and Self–Assembled Monolayers", *Langmuir*, vol. 11, pp. 16–19 (1995).

Gorman, Christopher, B., et al., "Control of the Shape of Liquid Lenses on a Modified Gold Surface Using an Applied Electrical Potential Across a Self–Assembled Monolayer", *Langmuir*, vol. 11, No. 6, pp. 2242–2246 (1995).

Calvert, Jeffrey M., et al., "Deep Ultraviolet Patterning of Monolayer Films for High Resolution Lithography", *J. Vac. Sci. Techn.*, vol. 9, No. 6, pp. 3447–3450 (Nov./Dec. 1991).

Calvert, Jeffrey M., et al., "New Surface Imaging Techniques for Sub–0.5 Micrometer Optical Lithography", *Solid State Tech.*, pp. 77–82 (Oct. 1991).

Calvert, Jeffrey, M., "Deep Ultraviolet Lithography of Monolayer Films with Selective Electroless Metalization", *J. Electrochem. Soc.*, vol. 139, No. 6, pp. 1677–1681 (Jun. 1992).

Bhatia, Suresh, K., et al., "Fabrication of Surfaces Resistant to Protein Adsorption and Application to Two–Dimensional Protein Patterning", *Biochem.*, vol. 208, pp. 197–205 (1993).

Stenger, David A., et al., "Coplanar Molecular Assemblies of Amino–and Perfluorinated Alkylsilanes: Characterization and Geometric Definition of Mammalian Cell Adhesion and Growth", *J. Am. Chem. Soc.*, vol. 114, pp. 8435–8442 (1992).

Dressick, Walter, J., et al., "Photopatterning and Selective Electroless Metalization of Surface–Attached Ligands", *Chem. Mat.*, vol. 3, pp. 149–150 (1993).

Koloski, Timothy, S., et al., "Nucleophilie Displacement Reactions at Benzyl Halide Self–Assembled Monolayer Film Surfaces", *Langmuir*, vol. 10, No. 9, pp. 3122–3133 (1994).

Potochnik, Stephen, J., et al., "Selective Copper Chemical Vapor Deposition Using Pd–Activated Organosilane Films", *Langmuir*, vol. 11, No. 6, pp. 1841–1845 (1995).

Hartney M. A., et al., "Silylation of Focused Ion Beam Exposed Resists", *Appl. Phys. Lett.*, vol. 59, No. 4, pp. 485–487 (Jul. 1991).

Ichinose, Nobuyuki, et al., "Immobilization of Protein on Micropatterns by the Use of Photoremovable Activated Ester", *Chem. Ltrs.*, pp. 237–238 (1995).

Kang, Doris, et al., "Patterned Functionalization of Gold and Single Crystal Silicon via Photochemical Reaction of Surface–Confined Derivatives of $(n^5-C_5H_5)Mn(CO)^{3}$", *Langmuir*, vol. 7, No. 10, pp. 2169–2174 (1991).

Lercel, M. J., et al., "Pattern Transfer of Electron Beam Modified Self–Assembled Monolayers for High–Resolution Lithography", *J. Vac. Sci. Techn.*, vol. 13, No. 3, pp. 1139–1143 (1995).

Pritchard, David, J., et al., "Micron–Scale Patterning of Biological Molecules", *Angew. Chem. Int. Ed. Engl.*, vol. 34, No. 1, pp. 91–92 (1995).

Rozsnyai, Lawerence, F., et al., "Selective Electrochemical Deposition of Polyaniline via Photopatterning of a Monolayer–Modified Substrate", *J. Am. Chem. Soc.*, vol. 116, pp. 5993–5994 (1994).

Sondag–Huethorst, J.A.M., et al., "Generation of Electrochemically Deposited Metal Patterns by Means of Electro Beam (nano)lithography of Self–Assembled Monolayer Resists", *Appl. Phys. Lett.*, vol. 64, pp. 285–287 (1994).

Wollman, Eric, W., et al., "Scanning Electron Microscopy for Imaging Photopatterned Self–Assembled Monolayers on Gold", *Langmuir*, vol. 9, No. 6, pp. 1517–1520 (1993).

Wollman, Eric, W., et al., "Photosensitive Self–Assembled Monolayers on Gold: Photochemistry of Surface–Confined Aryl Azide and Cyclopentadienylmanganese Tricarbonyl", *J. Am. Chem. Soc.*, vol. 116, No. 10, pp. 4395–4404 (1994).

Xia, Younan, et al., "Microcontact Printing of Octadecylsiloxane on the Surface of Silicon Dioxide and its Application in Microfabrication", *Am. Chem. Soc.*, pp. 9576–9577 (1995).

Kumar, Amit, et al., "Features of Gold Having Micrometer to Centimeter Dimensions can be Formed through a Combination os Stamping with an Elastomeric Stamp and an Alkanethiol "ink" followed by Chemical Etching", *Appl. Phys Lett.*, vol. 63, pp. 2002–2004 (1993).

Kleinfield, D., et al., "Controlled Outgrowth of Dissociated Neurons on Patterned Substrates", *Jrn. Neurosc.*, vol. 8, pp. 4098–4120 (1988).

Kelkar et al., "Acoustic Plate Waves for Measurement of Electrical Properties of Liquids", Microchem. Journal, vol. 43, pp. 155–164 (1991).

Liedberg et al, "Molecular Gradients of ω–Substituted Alkanethiols on Gold: Preparation and Characterization", Langmuir, vol. 11, pp. 3821–3827 (1995).

Shana et al, "Analysis of electrical equivalent circuit of quartz crystal resonator loaded with viscous conductive liquids", Journal of Electroanalytical Chemistry, vol. 379, pp. 21–33 (1994).

Shana et al., "Quartz Crystal Resonators as Sensors in Liquids Using the Acoustoelectric Effect", Anal. Chem., vol. 66, pp. 1955–1964 (1994).

Josse et al., "Electrical Surface Perturbation of a Piezoelectric Acoustic Plate Mode by a Conductive Liquid Loading", IEEE Transactions on Ultrasonics, Ferroelectrics, and Frequency Control, vol. 39, No. 4, (Jul. 1992).

Josse et al., "On the use of ZX–LiNbO3 acoustic plate mode devices as detectors for dilute electrolytes", Sensors and Actuators B, vol. 9, pp. 97–112 (1992).

Daphint et al., "Probing of strong and weak electrolytes with acoustic wave fields", Sensors and Actuators B, vol. 9, pp. 155–162 (1992).

Osada et al., "Intelligent Gels", Scientific American, pp. 82–87, May 1993.

Saito et al., "Volume Phase Transition of N–Alkylacrylamide Gels", Advances on Polymer Science, vol. 109, pp. 207–232 (1993).

Okano T. "Molecular Design of Temperature–Responsive Polymers as Intelligent Materials", Advances in Polymer Science, vol. 110, pp. 179–197 (1993).

Shibayama et al., "Volume Phase Transition and Related Phenomena of Polymer Gels", Advances in Polymer Science, vol. 109, pp. 1–62 (1993).

Kokufuta, E. "Novel Applications for Stimulus–Sensitive Polymer Gels in the Preparation of Functional Immobilized Biocatalysts", Advances in Polymer Science, vol. 110, pp. 157–177 (1993).

Osada et al, "Stimuli–Responsive Polymer Gels and Their Application to Chemomechanical Systems", Prog. Polym. Sci., vol. 18, pp. 187–266 (1993).

Irie, M. "Stimuli–Responsive Poly(N–isopropylacrylamide Photo– and Chemical–Induced Phase Transitions", Advances in Polymer Science, vol. 110, pp. 49–65 (1993).

Tsai, et al., Letter to the Editor, "Comment on the Prediction of Segregation of Alloy Surfaces," *Journal of Catalysts*, vol. 50, pp. 200–202 (1977).

Johnson et al., "Orientation Dependence of Surface Segregation in a Dilute Ni–Au Alloy," *J. Vac. Sci. Technol.*, vol. 15, No. 2, pp. 457–469 (Mar./Apr. 1978).

Seah, M.P., "Quantitative Prediction of Surface Segregation," *Journal of Catalysts*, vol. 57, pp. 450–457 (1979).

Kumar et al., "Patterned Condsensation Figures as Optical Diffraction Gratings," *Science*, vol. 263, pp. 60–62 (Jan. 7, 1994).

Folkers et al., "Self–Assembled Monolayers of Long–Chain Hydroxamic Acids on the Native Oxides of Metals," *Langmuir*, vol. 11, No. 3, pp. 813–824 (1995).

Jeon et al., "Patterned Self–Assembled Monolayers Formed by Microcontact Printing Direct Selective Metalization by Chemical Vapor Deposition on Planar and Nonplanar Substrates," *Langmuir*, vol. 11, No. 8, pp. 3024–3026 (1995).

Abbott et al., "Using Micromachining, Molecular Self–Assembly, and Wet Etching to Fabricate 0.1–1–$\mu$m–Scale Structures of Gold and Silicon," *Chem. Mater.*, vol. 6, No. 5, pp. 596–602 (1994).

Mrksich et al., "Patterning Self–Assembled Monolayers Using Microcontact Printing: A New Technology For Biosensors?" *Tibtech*, vol. 13, pp. 228–235 (Jun. 1995).

Burton et al., "Predicition of Segregation of Alloy Surfaces from Bulk Phase Diagrams," *Physical Review Letters*, vol. 37, No. 21, pp. 1433–1436 (Nov. 22, 1976).

Seah, M.P., "Quantitative Predicition of Surface Segreagtion," *Journal of Catalysts*, vol. 57, pp. 450–457 (1979).

Glassman, A., ed. *Printing Fundamentals*, Tappi Press, Atlanta, Georgia (1981).

*Modern Plastics Encyclopedia*, McGraw–Hill Publishing Co., New York, New York, pp. 1923–1996.

6,020,047

POLYMER FILMS HAVING A PRINTED SELF-ASSEMBLING MONOLAYER

TECHNICAL FIELD

The present invention is in the field of contact printing and, more specifically the present invention is in the field of microcontact printing on polymer films.

BACKGROUND OF THE INVENTION

Microcontact printing is a technique for forming patterns of organic monolayers with μm and submicron lateral dimensions. It offers experimental simplicity and flexibility in forming certain types of patterns. It relies on the remarkable ability of self-assembled monolayers of long-chain alkanethiolates to form on gold and other metals. These patterns can act as nanometer resists by protecting the supporting metal from corrosion by appropriately formulated etchants, or, can allow for the selective placement of fluids on hydrophilic regions of the pattern. Patterns of self-assembled monolayers having dimensions that can be less than 1 μm are formed by using the alkanethiol as an "ink", and by printing them on the metal support using an elastomeric "stamp". The stamp is fabricated by molding a silicone elastomer using a master prepared by optical or X-ray microlithography or by other techniques.

Microcontact printing of patterned self-assembled monolayers brings to microfabrication a number of new capabilities. First, microcontact printing makes it possible to form patterns that are distinguished only by their constituent functional groups; this capability permits the control of surface properties such as interfacial free energies with great precision. Second, because micro-contact printing relies on molecular self-assembly, it generates a system that is (at least locally) close to a thermodynamic minimum and is intrinsically defect-rejecting and self-healing. Simple procedures, with minimal protection against surface contamination by adsorbed materials or by particles, can lead to surprisingly low levels of defects in the final structures. The procedure can be conducted at atmospheric pressure, in an unprotected laboratory atmosphere. Thus, microcontact printing is especially useful in laboratories that do not have routine access to the equipment normally used in microfabrication, or for which the capital cost of equipment is a serious concern. Third, the patterned self-assembled monolayers can be designed to act as resists with a number of wet-chemical etchants.

Working with liquid etchants suffers from the disadvantages of handling solvents and disposing of wastes, but also enjoys substantial advantages: a high degree of control over contamination of surfaces; reduced damage to the substrate from energetic interactions with atoms or ions; the ability to manipulate complex and sensitive organic functionality. Because the self-assembled monolayers are only 1–3 nm thick, there is little loss in edge definition due to the thickness of the resist; the major determinants of edge resolution seem to be the fidelity of the contact printing and the anisotropy of etching the underlying metal. In the current best cases, features of size 0.2 μm can be fabricated; edge resolution in systems showing this resolution in feature size is less than 50 nm.

In the prior art, a gold film 5 to 2000 nanometers thick is typically supported on a titanium-primed $Si/SiO_2$ wafer or glass sheet. The titanium serves as an adhesion promoter between gold and the support. However, the silicon wafer is rigid, brittle, and cannot transmit light. These silicon wafers are also not suitable for a large-scale, continuous printing process, such as in letterpress, gravure, offset, and screen printing (see *Printing Fundamentals*, A. Glassman, Ed. (Tappi Press Atlanta, Ga. 1981); *Encyclopedia Britannica*, vol. 26, pp. 76–92, 110–111 (Encyclopedia Brittanica, Inc. 1991)). In addition, silicon must be treated in a separate step with an adhesion promoter such as Cr or Ti, or Au will not adequately adhere, preventing formation of a stable and well-ordered self-assembling monolayer. Finally, silicon is opaque, so any diffraction pattern obtained must be created with reflected, not transmitted light. What is needed is an easy, efficient and simple method of contact printing on an optically transparent, flexible substrate, that is amenable to continuous processing.

SUMMARY OF THE INVENTION

The present invention comprises methods of contact printing of patterned, self-assembling monolayers of alkanethiolates, carboxylic acids, hydroxamic acids, and phosphonic acids on thermoplastic films metallized with an alloy such as nickel/gold, the compositions produced thereby, and the use of these compositions.

Patterned self-assembling monolayers allow for the controlled placement of fluids thereon which can contain a chemically reactive, indicator functionality. The optical sensing devices produced thereby when the film is exposed to an analyte and light, can produce optical diffraction patterns which differ depending on the reaction of the self-assembling monolayer with the analyte of interest. The light can be in the visible spectrum, and be either reflected from the film, or transmitted through it, and the analyte can be any compound reacting with the self-assembling monolayer. The present invention also provides a flexible support for a self-assembling monolayer on a metal alloy.

The present invention includes a support for a self-assembling monolayer on a metal alloy which does not require an adhesion promoter for the formation of a well-ordered self-assembling monolayer. The present invention also provides a support for a self-assembling monolayer on a metal alloy which is suitable for continuous, rather than batch, fabrication. Finally the present invention provides a low-cost, disposable sensor which can be mass produced.

These and other objects, features and advantages of the present invention will become apparent after a review of the following detailed description of the disclosed embodiments.

BRIEF DESCRIPTION OF THE FIGURES

FIG. 3b is a photograph of the diffraction pattern formed by visible light shown through the self-assembling monolayer pattern described by FIG. 3a.

DETAILED DESCRIPTION

The present invention provides methods of contact printing of patterned, self-assembling monolayers of alkanethiolates, carboxylic acids, hydroxamic acids, and phosphonic acids on polymer films metallized with an alloy such as nickel/gold, desirably thermoplastic polymer films, the compositions produced thereby, and the use of these compositions. Patterned self-assembling monolayers allow for the controlled placement of fluids thereon which can contain a chemically reactive, indicator functionality. The term "patterned self-assembling monolayers thereon" as used herein means the self-assembling monolayers in any pattern on the metallized polymer films including a solid pattern.

In one embodiment, optical sensing devices can be produced according to the present invention. When the film with the self-assembling monolayers thereon is exposed to an analyte that is capable of reacting with the self-assembling monolayer, the film will produce optical diffraction patterns which differ depending on the reaction of the self-assembling monolayer with the analyte of interest. The liquid may be a high surface tension fluid such as water. The light can be in the visible spectrum, and be either reflected from the film, or transmitted through it, and the analyte can be any compound reacting with the self-assembling monolayer.

Self-assembled monolayers of organic compounds on inorganic or metal surfaces are becoming increasingly important in many areas of materials science. Although there are many different systems of self-assembling monolayers based on different organic components and supports, desired systems are those of alkanethiolates, $HS(CH_2)_n R$. Typically, a gold film, 5 to 2000 nm thick, is supported on a titanium-primed $Si/SiO_2$ wafer or glass sheet. The titanium serves as an adhesion promoter between gold and the support. The alkanethiols chemisorb on the gold surface from a solution in which the gold film is immersed, and form adsorbed alkanethiolates with loss of hydrogen. Adsorption can also occur from the vapor. Self-assembling monolayers formed on gold from long-chain alkanethiolates of structure $X(CH_2)_n Y(CH_2)_m S$ are highly ordered and can be considered as crystalline or quasi-crystalline molecular arrays. A wide variety of organic functional groups (X,Y) can be incorporated into the surface or interior of the monolayer.

Self-assembling monolayers can therefore be tailored to provide a wide variety of material properties: wettability and protection against corrosion by chemical etchants are especially relevant to $\mu$CP. In one embodiment of the invention, there are two or more self-assembling monolayers with different chemical properties. In another embodiment of the invention, a first self-assembling monolayer is hydrophobic, and a second self-assembling monolayer is hydrophilic.

Figure 1:
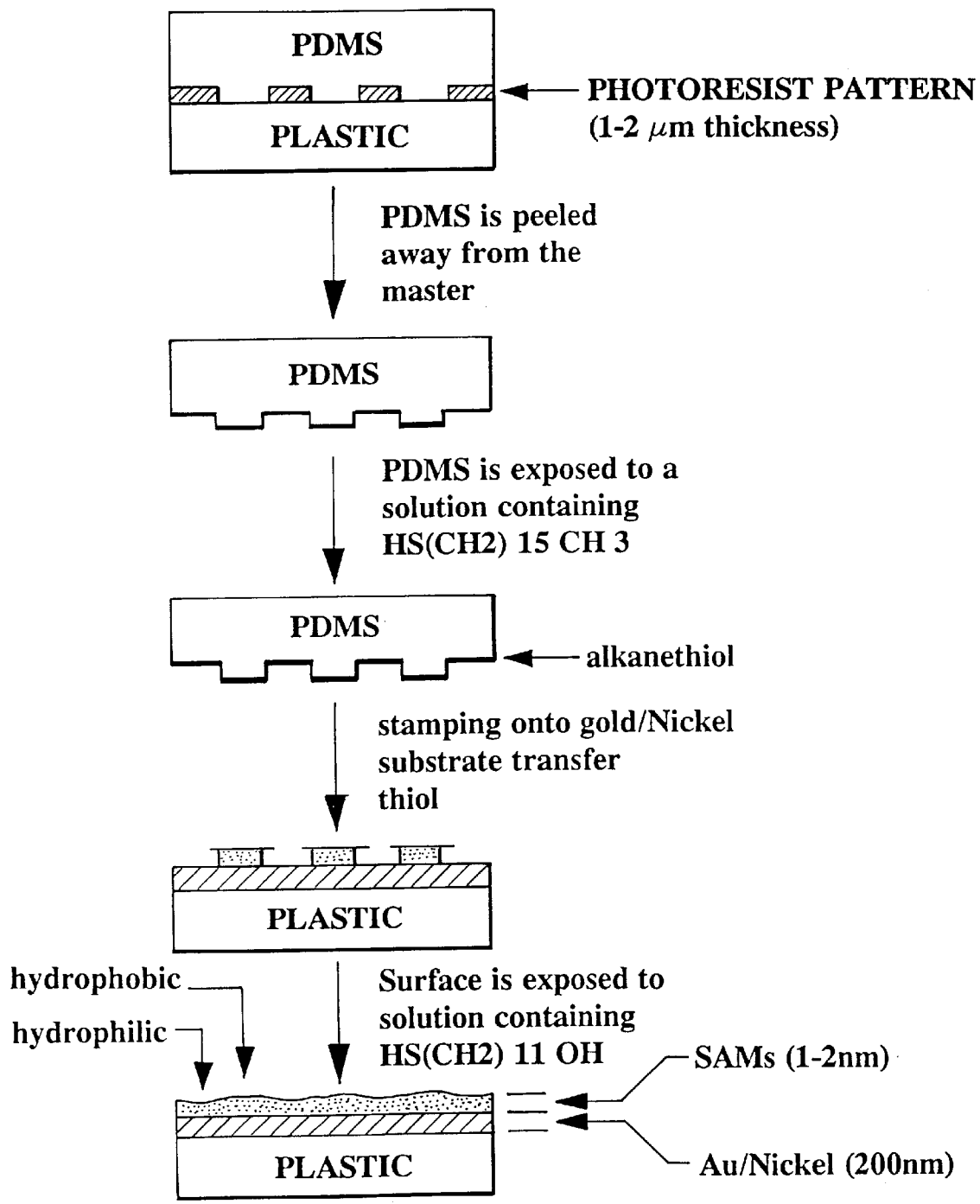
FIG. 1 is a schematic of contact printing of self-assembling monolayers, using a nickel/gold coated polymer substrate as an example. A polydimethylsiloxane (PDMS; silicone elastomer 184; Dow Corning Corp., Midland, Mich.) is polymerized on a silicone master containing a pre-determined pattern. The PDMS is peeled away from the master, and then exposed to a solution containing $HS(CH_2)_{15}CH_3$. The alkane-thiol coated stamp is then stamped onto the nickel/gold-coated substrate. Then, the surface of the substrate is exposed to a solution containing a different alkane thiol such as $HS(CH_2)_{11}OH$.

FIG. 1 outlines the procedure used for microcontact printing. An elastomeric stamp is used to transfer by contact alkanethiol "ink" to a surface coated with a metal alloy. In a preferred embodiment, the alloy surface is predominantly gold. Preferred alloys are those such as nickel/gold, which are known to show an enrichment in the surface concentration of gold relative to its bulk concentration. Prediction of surface segregation of one metal of an alloy is described in M. P. Seah, "Quantitative Prediction of Surface Segregation," *Journal of Catalysis*, vol. 57, pp. 450–457 (1979), and J. J. Burton, et al., "Prediction of Segregation to Alloy Surfaces from Bulk Phase Diagrams," *Physical Review Letters*, vol. 37, No. 21, pp. 1433–1436 (Nov. 22, 1976), both incorporated herein by reference. In one embodiment of the invention, the metal alloy has surface enrichment of a metal reacting with the self-assembling monolayer. If the stamp is patterned, a patterned self-assembling monolayer forms. The stamp is fabricated by casting polydimethylsiloxane (PDMS) on a master having the desired pattern. Masters are prepared using standard photolithographic techniques, or constructed from existing materials having microscale surface features.

In a typical experimental procedure, a photolithographically produced master is placed in a glass or plastic Petri dish, and a 10:1 ratio (w:w or v:v) mixture or SYLGARD® silicone elastomer 184 and SYLGARD® silicone elastomer 184 curing agent (Dow Corning Corporation) is poured over it. The elastomer is allowed to sit for approximately 30 minutes at room temperature and pressure to degas, then cured for 1–2 hours at 60° C., and gently peeled from the master. "Inking" of the elastomeric stamp is accomplished by exposing the stamp to a 0.1 to 1.0 mM solution of alkanethiol in anhydrous ethanol, either by pouring the solution over the surface of the stamp, or by rubbing the stamp gently with a Q-TIP® that has been saturated with the inking solution. The stamp is allowed to dry until no liquid is visible by eye on the surface of the stamp (typically about 60 seconds), either under ambient conditions, or by exposure to a stream of nitrogen gas. Following inking, the stamp is applied (typically by hand) to a metal alloy, e.g., nickel/gold surface. Very light hand pressure is used to aid in complete contact between the stamp and the surface. The stamp is then gently peeled from the surface. Following removal of the stamp, the surface is washed of excess thiol and the patterned metal alloy surface can be subjected to chemical etchants (see below) that selectively remove underivatized areas of the metal alloy surface, and if desired, the underlying support(s). Alternatively, further derivatization of unstamped areas can be accomplished, either by using a second stamp, or by washing the entire surface with a different alkanethiol.

The elastomeric character of the stamp is essential to the success of the process. Polydimethylsiloxane (PDMS), when cured, is sufficiently elastomeric to allow good conformal contact of the stamp and the surface, even for surfaces with significant relief; this contact is essential for efficient contact transfer of the alkanethiol "ink" to the alloy-coated film. The elastomeric properties of PDMS are also important when the stamp is removed from the master: if the stamp were rigid (as is the master) it would be difficult to separate the stamp and master after curing without damaging one of the two substrates. PDMS is also sufficiently rigid to retain its shape, even for features with sub-micron dimensions: we have successfully generated patterns with lines as small as 200 nm in width. The surface of PDMS has a low interfacial free energy (y=22.1 dynes/cm), and the stamp does not adhere to the metal alloy coated film. The stamp is durable: we have used the same stamp up to 100 times over a period of several months without significant degradation in performance. The polymeric nature of PDMS also plays a critical role in the inking procedure, by enabling the stamp to absorb the alkanethiol ink by swelling.

Microcontact printing on metal alloy surfaces can be conducted with a variety of alkanethiol "inks". Alkanethiols that do not undergo reactive spreading (after application to the metal alloy film) are required for formation of small features with high resolution. For stamping in air, one can use autophobic alkanethiols such as hexadecanethiol. Microcontact printing of other non-autophobic alkanethiols, for example, $HS(CH_2)_{15}COOH$, can be conducted by stamping under a liquid such as water. Patterned self-assembling monolayers of alkanethiols on metal alloy provide excellent resist character with a number of wet-chemical etchants.

In one embodiment of the present invention, the self-assembling monolayer is formed of a carboxy-terminated alkane thiol stamped with a patterned elastomeric stamp onto a nickel/gold-surfaced thermoplastic film such as MYLAR®. The alkanethiol is inked with a solution of alkanethiol in ethanol, dried, and brought into contact with a surface of nickel/gold. The alkanethiol is transferred to the surface only at those regions where the stamp contacts the surface, producing a pattern of self-assembling monolayer which is defined by the pattern of the stamp. Optionally, areas of unmodified nickel/gold surface next to the stamped areas can be rendered hydrophobic by reaction with a methyl-terminated alkane thiol.

A more detailed description of the methods and compositions of the present invention follows. All publications cited herein are incorporated by reference in their entirety.

Any thermoplastic film upon which a metal substrate can be deposited is suitable for the present invention. These include, but are not limited to polymers such as: polyethylene-terephthalate (MYLAR®), acrylonitrile-butadiene-styrene, acrylonitrile-methyl acrylate copolymer, cellophane, cellulosic polymers such as ethyl cellulose, cellulose acetate, cellulose acetate butyrate, cellulose propionate, cellulose triacetate, cellulose triacetate, polyethylene, polyethylene-vinyl acetate copolymers, ionomers (ethylene polymers) polyethylene-nylon copolymers, polypropylene, methyl pentene polymers, polyvinyl fluoride, and aromatic polysulfones. Preferably, the plastic film has an optical transparency of greater than 80%. Other suitable thermoplastics and suppliers may be found, for example, in reference works such as the *Modern Plastics Encyclopedia* (McGraw-Hill Publishing Co., New York 1923–1996).

In one embodiment of the invention, the thermoplastic film with the metal coating thereon has an optical transparency of between approximately 5% and 95%. A more desired optical transparency for the thermoplastic film used in the present invention is between approximately 20% and 80%. In a desired embodiment of the present invention, the thermoplastic film has at least an approximately 80% optical transparency, and the thickness of the metal coating is such as to maintain an optical transparency greater than about 20%, so that diffraction patterns can be produced by either reflected or transmitted light. This corresponds to a metal coating thickness of about 20 nm. However, in other embodiments of the invention, the gold thickness may be between approximately 1 nm and 1000 nm.

The preferred metal alloy for deposition on the film is gold and another metal. However, alloys of silver, aluminum, copper, iron, zirconium, platinum, nickel may also be used. Preferred metals are ones that do not form oxides, and thus assist in the formation of more predictable self-assembling monolayers. Alloys such as Ni/Au, Pt/Au, and Cu/Au, which show surface enrichments of Au, are suitable.

In principle, any surface with corrugations of appropriate size could be used as masters. The process of microcontact printing starts with an appropriate relief structure, from which an elastomeric stamp is cast. This 'master' template may be generated photolithographically, or by other procedures, such as commercially available diffraction gratings. In one embodiment, the stamp may be made from polydimethylsiloxane.

In one embodiment of the present invention, the self-assembling monolayer has the following general formula:

X is reactive with metal or metal oxide. For example, X may be asymmetrical or symmetrical disulfide (—R'SSR, —RSSR), sulfide (—R'SR, —RSR), diselenide (—R'Se—SeR), selenide (—R'SeR, —RSeR), thiol (—SH), nitrile (—CN), isonitrile, nitro (—NO$_2$), selenol (—SeH), trivalent phosphorous compounds, isothiocyanate, xanthate, thiocarbamate, phosphine, thioacid or dithioacid, carboxylic acids, hydroxylic acids, and hydroxamic acids.

R and R' are hydrocarbon chains which may optionally be interrupted by hetero atoms and which are preferably non-branched for the sake of optimum dense packing. At room temperature, R is greater than or equal to seven carbon atoms in length, in order to overcome natural randomizing of the self-assembling monolayer. At colder temperatures, R may be shorter. In a preferred embodiment, R is —$(CH_2)_n$— where n is between 10 and 12, inclusive. The carbon chain may optionally be perfluorinated.

Y may also have any surface property of interest. For example, Y could be any among the great number of groups used for immobilization in liquid chromatography techniques, such as hydroxy, carboxyl, amino, aldehyde, hydrazide, carbonyl, epoxy, or vinyl groups. Examples of sensing layer materials are set forth in "Patterning Self-Assembled Monolayers Using Microcontact Printing: A New Technology for Biosensors?," by Milan Mrksich and George M. Whitesides, published in TIBTECH, June, 1995 (Vol. 13), pp. 228–235, hereby incorporated by reference.

Self-assembling monolayers of alkyl phosphonic, hydroxamic, and carboxylic acids may also be useful for the methods and compositions of the present invention. Since alkanethiols do not adsorb to the surfaces of many metal oxides, carboxylic acids, phosphonic acids, and hydroxamic acids may be preferred for X for those metal oxides. See J. P. Folkers, G. M. Whitesides, et al., *Langmuir*, 1995, vol. 11, pp. 813–824.

R may also be of the form $(CH_2)_a$—Z—$(CH_2)_b$, where $a \geq 0$, $b \geq 7$, and Z is any chemical functionality or compound of interest, such as sulfones, urea, lactam, etc.

The stamp may be applied in air, or under a fluid such as water to prevent excess diffusion of the alkanethiol. For large-scale or continuous printing processes, it is most desirable to print in air, since shorter contact times are desirable for those processes.

In one embodiment of the present invention, the pattern is formed on the metallized thermoplastic polymer with the self-assembling monolayer. In another embodiment of the present invention, the relief of the pattern is formed with the self-assembling monolayer. After the stamping process, the metallized areas on the plastic may optionally be passivated, for example, with a methyl-terminated self-assembling monolayer such as hexadecylmercaptan.

This invention is further illustrated by the following example, which is not to be construed in any way as imposing limitations upon the scope thereof. On the contrary, it is to be clearly understood that resort may be had to various other embodiments, modifications, and equivalents thereof, which, after reading the description herein, may suggest themselves to those skilled in the art without departing from the spirit of the present invention.

Example 1

Printing of nickel/gold-coated MYLAR® (polyethylene terephthalate) with patterns of 16-mercaptohexadecanoic acid and hexadecanethiol A nickel/gold alloy was sputter-coated onto 7 mil MYLAR® of 15.9 nM thickness. The composition had 65% visible light transmittance, and 65 ohms/cm$^2$ resistance. The following results from XPS surface analysis were obtained.

| Sputter Time (sec) | % C | % 0 | % Au | % Ni |
|---|---|---|---|---|
| 0 | 51.5 | 8.0 | 40.5 | ND |
| 15 | 33.3 | 6.4 | 60.3 | ND |
| 30 | 20.2 | ND | 71.7 | 8.0 |
| 60 | 19.3 | ND | 72.4 | 8.3 |

ND means "not detected", i.e., less than 0.2 atom-percent.

These results show that the outermost surface of the Ni/Au alloy is predominantly Au, i.e., Ni is not detected until after approximately 5.0 nM of Au is removed. Thus, the alloy presents a surface that resembles pure gold and can be used as a "pure gold" surface for contact printing.

Figure 2A:
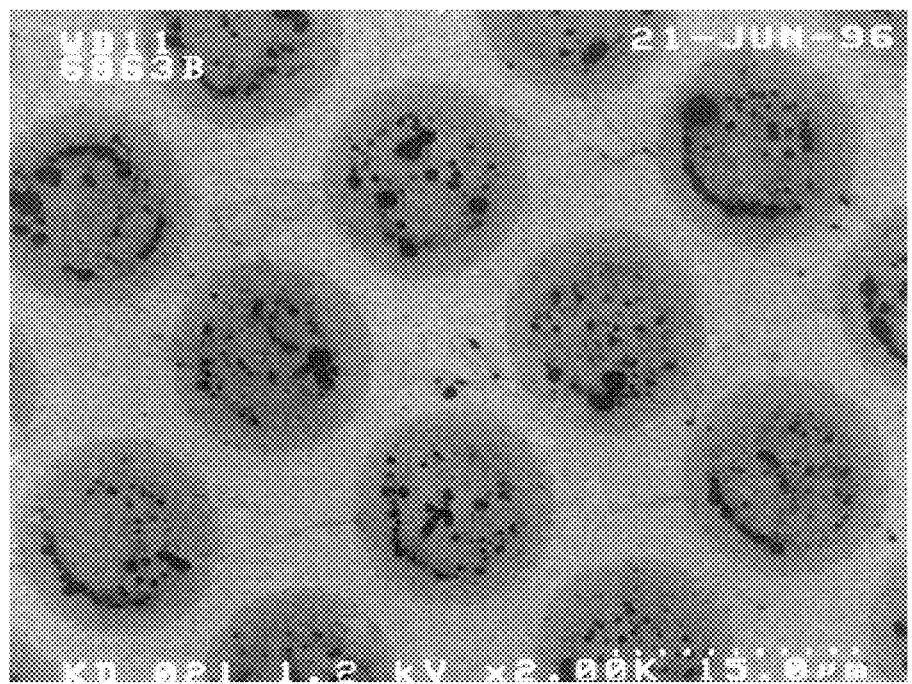
FIG. 2 is a field emission secondary electron microscope image of 10 micron-diameter circles of hydrophilic self-assembling monolayers formed by printing of 16-mercaptohexadecanoic acid onto MYLAR® metallized with Ni/Au alloy, as described in Example 1.
Figure 2B:
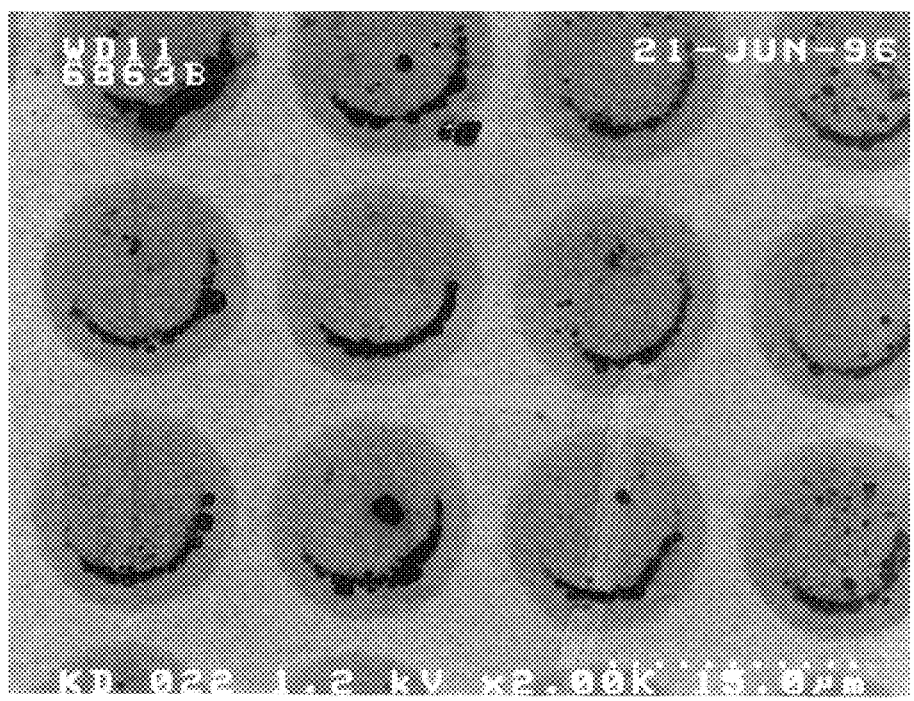

MYLAR® film modified with a sputter-deposited nickel/alloy topcoat was obtained from Courtaulds Performance Films (21034 Osborne Street, Canoga Park, Cailf. 91304). Patterns of hydrophilic, carboxy-terminated alkane thiols were stamped onto the Ni/Au metallized MYLAR® using $CH_3(CH_2)_{15}SH$ and $HOC(O)(CH_2)_{14}SH$ acid by the following method. (See FIG. 1). An exposed and developed photoresist pattern of 10 micron diameter circles on a silicon wafer was used as the master. Polydimethylsiloxane (PDMS; silicone elastomer 184; Dow Corning Co., Midland, Mich.), was polymerized on a master to produce a stamp with ten micron-diameter circles spaced five microns apart. The stamp was inked by exposure to a solution (1 to 10 mM in ethanol) of 16-mercaptohexadecanoic acid, and allowed to air-dry. The substrate was contacted with the stamp for 50 seconds and washed for 2 to 4 seconds with a solution of hexadecanethiol (1 to 10 mM in ethanol). The substrate was finally washed for 10 seconds in ethanol and dried in a stream of nitrogen. The results of this printing are shown in FIG. 2.

Figure 3A:
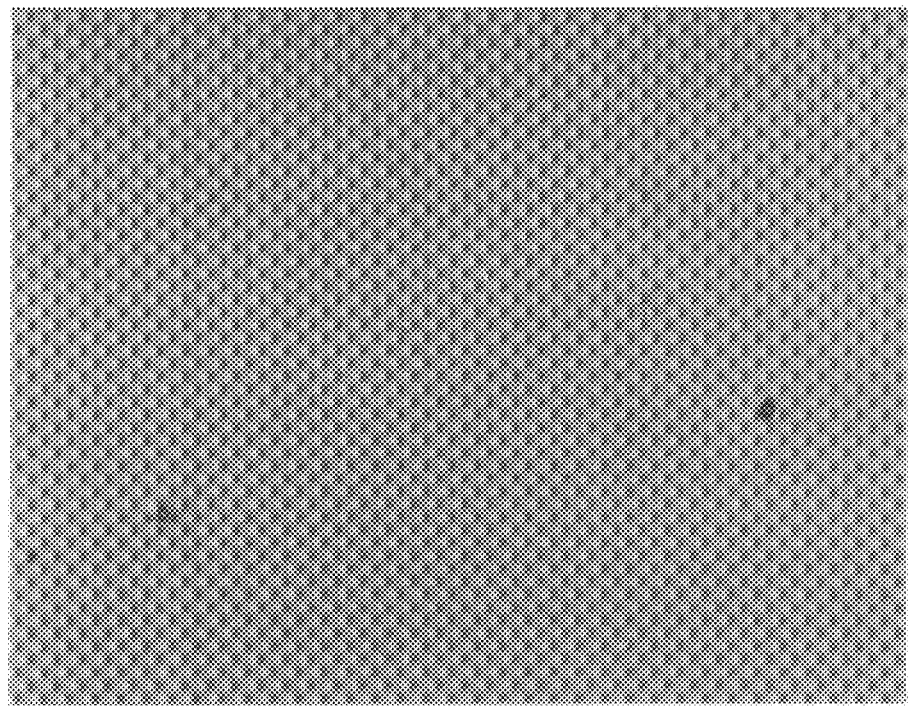
FIG. 3a is an optical photomicrograph at 300× magnification of 10 micron-diameter circles of hydrophilic self-assembling monolayers formed by printing of 16-mercaptohexadecanoic acid, as described in Example 1, below, and after exposure to a high surface energy, curable, optical adhesive. The adhesive was cured by ultraviolet light (UV) exposure.

These hydrophilic self-assembling monolayer circles allow for selective placement of high surface tension fluids such as water, triethylene glycol, or ultraviolet light curable urethane acrylic adhesives. These liquids can contain dissolved and suspended reagents that react chemically or physically with targeted analytes, thus making the coated plastic film a collection of 10 micron microreactors suitable for low-cost, disposable chemical sensors. An example of such a device is shown in FIG. 3a.

Figure 3B:
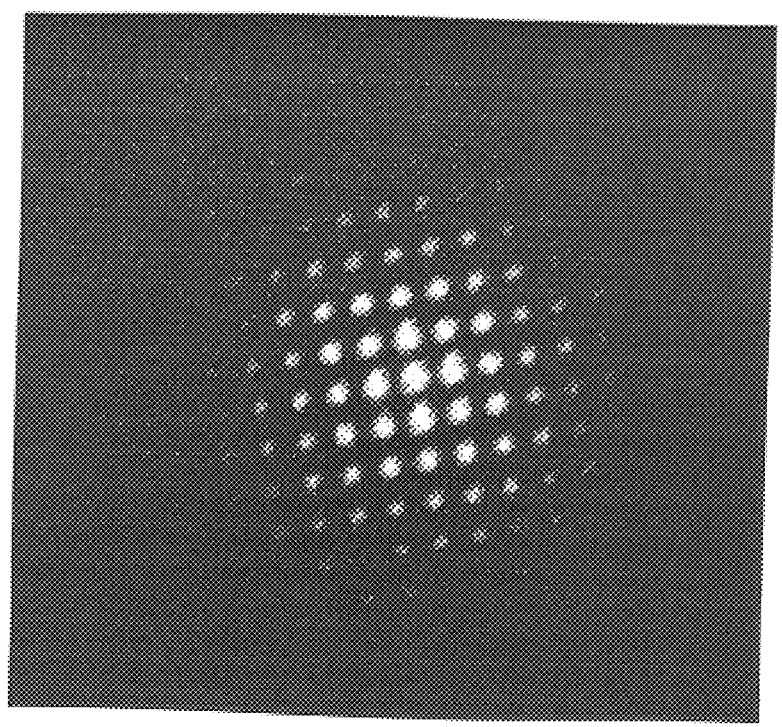

Diffraction of visible light was shown with these compositions. Both reflected and transmitted diffraction patterns were observed when using 5 mW, 670 nM laser illumination. FIG. 3b is a photograph of the diffraction pattern formed by visible light shown through the self-assembling monolayer pattern of FIG. 3a. Rainbow diffraction colors were observed with transmitted white light.

Measurement of Contact Angles

Contact angles were measured on a Rame-Hart Model 100 goniometer at room temperature and ambient humidity. Water for contact angles was deionized and distilled in a glass and TEFLON® apparatus. Advancing and receding contact angles were measured on both sides of at least three drops of each liquid per slide; data in the figures represents the average of these measurements. The following method was used for measuring contact angles: A drop approximately 1–2 microliters in volume was grown on the end of a pipette tip (Micro-Electrapette syringe; Matrix Technologies; Lowell, Mass.). The tip was then lowered to the surface until the drop came in contact with the surface. The drop was advanced by slowly increasing the volume of the drop (rate approximately 1 microliter/second). Advancing contact angles of water were measured immediately after the front of the drop had smoothly moved a short distance across the surface. Receding angles were taken after the drop had smoothly retreated across the surface by decreasing the volume of the drop.

X-ray Photoelectron Spectroscopy (XPS)

X-ray photoelectron spectra were collected on a Surface Science SSX-100 spectrometer using a monochromatized Al K-alpha source (hv=1486.6 electron volts). The spectra were recorded using a spot size of 600 micrometers and a pass energy on the detector of 50 electron volts (acquisition time for one scan was approximately 1.5 minutes). For the monolayers, spectra were collected for carbon and oxygen using the Is peaks at 285 and 530 eV, respectively; the binding energies for elements in the monolayer were referenced to the peak due to hydrocarbon in the C Is region, for which we fixed the binding energy at 284.6 eV. Spectra for the solid hydroxamic acid were collected using an electron flood gun of 4.5 eV to dissipate charge in the sample. The binding energies for the substrates were not standardized to a reference sample. All spectra were fitted using an 80% Gaussian/20% Lorentzian peak shape and a Shirley background subtraction. See J. P. Folkers, G. M. Whitesides, et al., *Langmuir*, vol. 11, no. 3, pp. 813–824 (1995).

Condensation Figures

Condensation figures (CFs) are arrays of liquid drops that form upon condensation of vapor onto a solid surface. The examination of condensation figures has historically been used as a method to characterize the degree of contamination on an otherwise homogeneous surface. One is able to impose a pattern on arrays of condensed drops by patterning the surface underlying them into regions of different solid-vapor interfacial free energy and to characterize the patterned CFs by photomicroscopy and optical diffraction. It can be demonstrated that appropriately patterned CFs can be used as optical diffraction gratings and that examination of the diffraction patterns provides both a rapid, nondestructive method for characterizing patterned self-assembling monolayers and an approach to sensing the environment. Because the form of the CFs—that is, the size, density, and distribution of the drops is sensitive to environmental factors, CFs of appropriate size and pattern diffract light and can be used as sensors. This principle is demonstrated by correlating the temperature of a substrate patterned into hydrophobic and hydrophilic regions, in an atmosphere of constant relative humidity, with the intensity of light diffracted from CFs on these regions.

Appropriate patterns are formed from self-assembled monolayers (self-assembling monolayers) on gold/nickel by using combinations of hexadecanethiol [$CH_3(CH_2)_{15}SH$], 16-mercaptohexadecanoic acid [$HS(CH_2)_{14}COOH$], and 11-mercaptoundecanol [$HS(CH)_{11}OH$]. Several techniques are now available for preparing patterns of two or more self-assembling monolayers having 0.1- to 10-µm dimensions.

At 20° C., an incident beam of light from a laser (helium-neon laser, wavelength=632.8 nm) produced a single transmitted spot because no water had condensed on the surface, and the transmittance of the regions covered with different self-assembling monolayers were effectively indistinguishable. As the surface was exposed to warm, moist air, droplets of water condensed preferentially on the hydrophilic regions. Diffraction patterns appeared in the light transmitted from the surface. Under these conditions, light was transmitted coherently from the regions where no water had condensed and was scattered by the regions where water had condensed. The condensation figures disappeared within several seconds as the water droplets which condensed on the self-assembling monolayers evaporated.

The ability to form condensation figures can be ascertained by the relative contact angles of water on the hydrophobic and hydrophilic self-assembling monolayers. Unpatterned monolayers of the appropriate thiol were prepared by immersion of the substrate in a dilute solution for one hour, followed by rinsing with ethanol and air drying.

The contact angles of water on Au(Ni)/MyLAR reacted with $CH_3(CH_2)_{15}SH$ and $HOC(O)(CH_2)_{14}SH$ were 100° and 62, respectively. The untreated Au(Ni)/MyLAR contact angle for water was 73–77. This water contact angle is similar to that obtained for Au coated SiOx wafers, which is 73–74° (data not shown).

Condensation Figures [*Science*, Vol. 263, 60 (1994), incorporated herein by reference] with equivalent optical diffraction can be formed on Au/Ni:MYLAR®, relative to known art with Au:SiOx. The chemistry of alkane-thiols reacting with Au/Ni:MYLAR is similar to that reported in the literature for Au:SiOx.

A field emission secondary electron microscope image of 10 micron-diameter circles of hydrophilic self-assembling monolayers formed by printing of 16-mercaptohexadecanoic acid onto MYLAR® metallized with Ni/Au alloy is shown in FIG. 2. FIG. 3a is an optical photomicrograph at 300× magnification of 10 micron-diameter circles of hydrophilic self-assembling monolayers formed by printing of 16-mercaptohexadecanoic acid, and after exposure to a high surface energy, curable, optical adhesive. The adhesive was cured by ultraviolet light (UV) exposure.

FIG. 3b is a photograph of the diffraction pattern formed by visible light shown through the self-assembling monolayer pattern described by FIG. 3a.

Figure 4A:
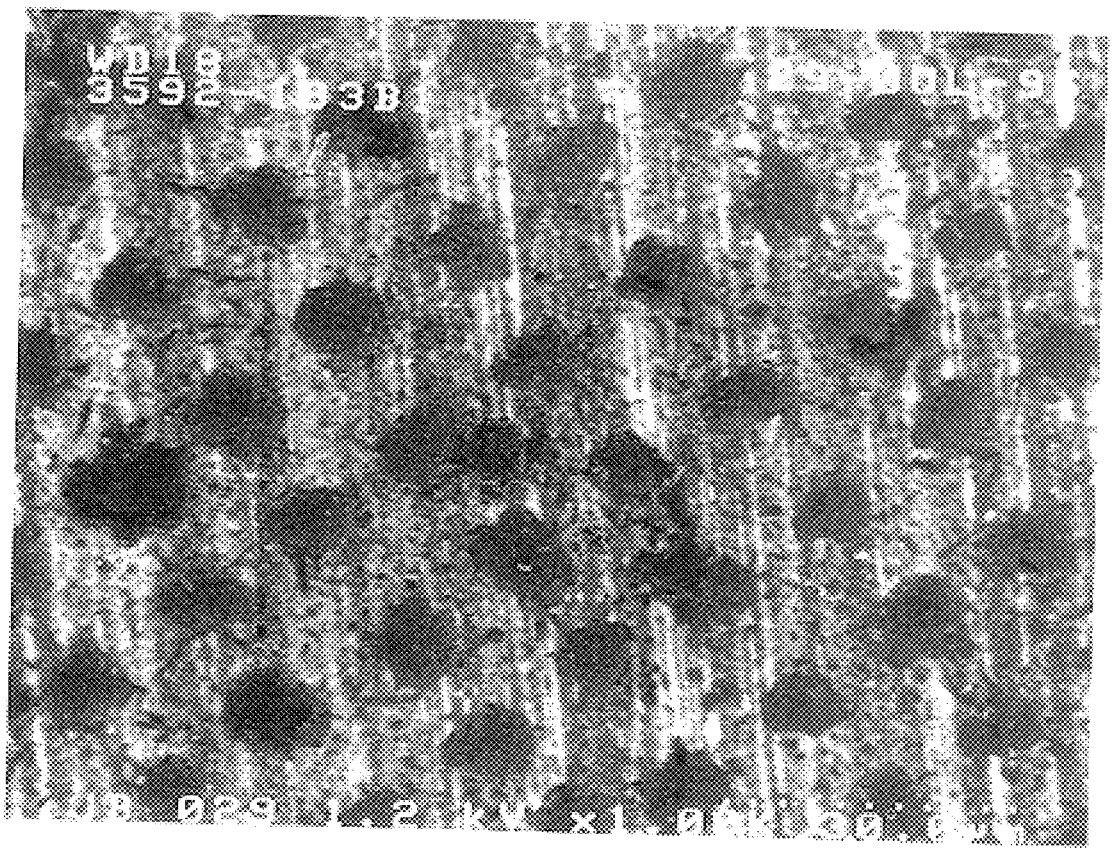
FIGS. 4a and 4b are a field emission secondary electron micrograph image of 10 micron-diameter circles formed of self-assembled photocurable polymers on hydrophilic self-assembling monolayers, printed as described in Example 1.
Figure 4B:
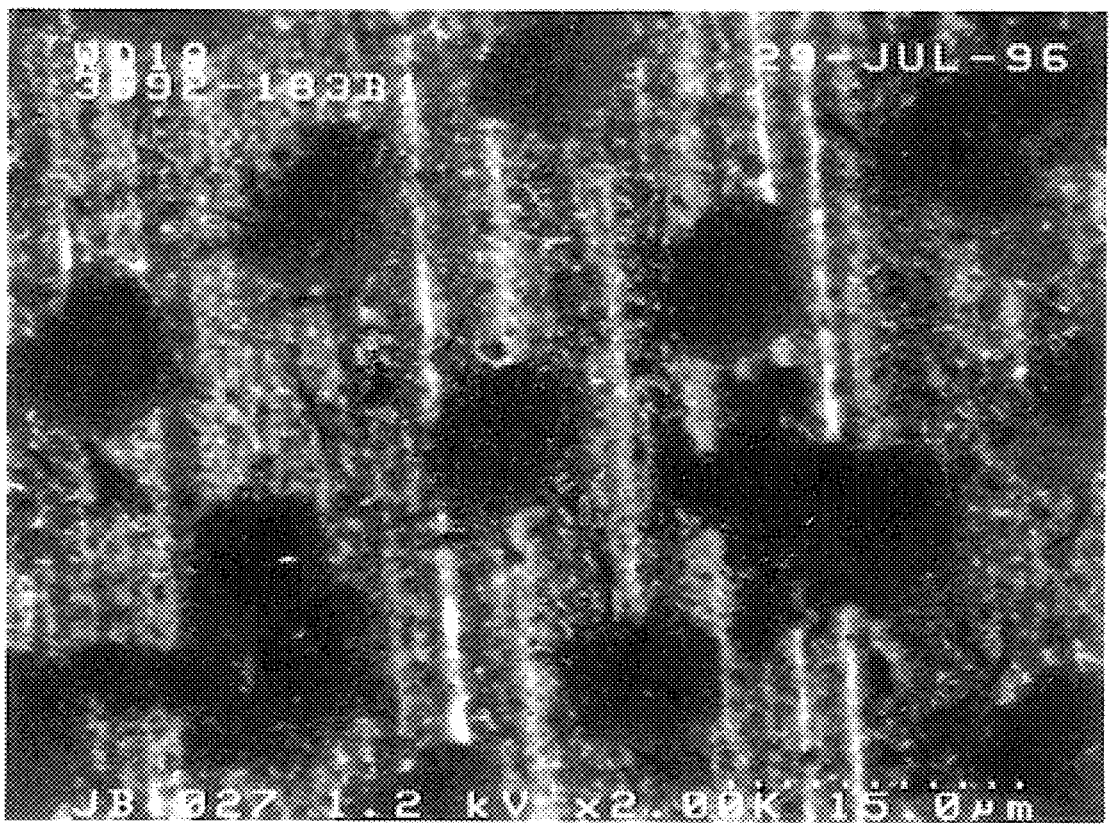

FIGS. 4a and 4b are field emission secondary electron micrograph images of 10 micron-diameter circles formed of self-assembled photocurable polymers on hydrophilic self-assembling monolayers.

Those skilled in the art will now see that certain modifications can be made to the invention herein disclosed with respect to the illustrated embodiments, without departing from the spirit of the instant invention. And while the invention has been described above with respect to the preferred embodiments, it will be understood that the invention is adapted to numerous rearrangements, modifications, and alterations, all such arrangements, modifications, and alterations are intended to be within the scope of the appended claims.

What is claimed is:

1. A film with patterned self-assembling monolayers thereon comprising:
   a polymer film coated with a metal alloy; and
   a self-assembling monolayer printed onto the polymer film.

2. The film of claim 1, wherein the metals to be alloyed are selected from the group consisting essentially of gold, silver, nickel, platinum, aluminum, iron, copper, and zirconium.

3. The film of claim 1, wherein the alloy coating is between approximately 1 nanometer and 1000 nanometers in thickness.

4. The film of claim 1, wherein the polymer film is selected from the group consisting of polyethylene-terephthalate, acrylonitnile-butadiene-styrene, acrylonitrile-methyl acetate copolymer, cellophane, cellulosic polymers such as ethyl cellulose, cellulose acetate, cellulose acetate butyrate, cellulose propionate, cellulose triacetate, polyethylene, polyethylene-vinyl acetate compolymers, ionomers (ethylene polymers) polyethylene-nylon copolymers, polypropylene, methyl pentene polymers, polyvinyl fluoride, and aromatic polysulfones.

5. The film of claim 4, wherein the polymer film is polyethylene-terephthalate.

6. The film of claim 1, wherein the polymer film is optically transparent.

7. The film of claim 1, wherein the polymer film has an optical transparency between 5% and 95%.

8. The film of claim 1, wherein the polymer film has an optical transparency between 20% and 80%.

9. The film of claim 1, wherein the self-assembling monolayer comprises compounds with the following general formula:

$$X-R-Y$$

wherein:
X is reactive with the metal or metal oxide on the polymer film;
R is a hydrocarbon chain; and
Y is a compound with any property of interest;
wherein the self-assembling monolayer compound is attached to the polymer film through reaction of X with the metal or metal oxide on the polymer film.

10. The film of claim 9, wherein:
X is selected from the group consisting of an asymmetrical or symmetrical disulfide (—SSY', —SSY), sulfide (—"SY', SY), diselenide (—'Se—SeY'), selenide (—SeY', —SeY), thiol (—SH), nitrile (—CN), isonitrile, nitro (—$NO_2$), selenol (—SeH), trivalent phosphorous compounds, isothiocyanate, xanthate, thiocarbamate, phosphine, thioacid, dithioacid, carboxylic acids, hydroxylic acids, and hydroxamic acids;
R and R' are selected from hydrocarbon chains hydrocarbon chains interrupted by hetero atoms, hydrocarbon chains which are perfluorinated, or hydrocarbons which are non-branched; and
Y and Y' are selected from hydroxy, carboxyl, amino, aldehyde, hydrazide, carbonyl, epoxy, or vinyl groups.

11. The film of claim 9, wherein R is greater than 7 carbon atoms in length.

12. The film of claim 9, wherein R is a compound of the form $(CH_2)_a$—Z—$(CH_2)_b$, wherein $a \geq 0$, $b \geq 7$, and Z is any chemical functionality of interest.

13. The film of claim 12, wherein Z is selected from the group consisting of sulfones, lactams, and urea.

14. The film of claim 1, wherein the polymer film comprises a first self-assembling monolayer stamped on the polymer film and a second self-assembling monolayer located in unstamped areas of the polymer film, further wherein each self-assembling monolayer has different chemical properties.

15. The film of claim 14, wherein the first self-assembling monolayer is hydrophobic, and the second self-assembling monolayer is hydrophilic.

16. A film with patterned self-assembling monolayers thereon comprising:

a polymer film coated with a metal alloy; and a self-assembling monolayer printed onto the polymer film;

wherein the metal alloy has surface enrichment of a metal reacting with the self-assembling monolayer.

17. The film of claim 16 wherein the metal alloy is selected from the group consisting of Ni/Au, Pt/Au, and Cu/Au.

* * * * *